(12) United States Patent
Lamontagne et al.

(10) Patent No.: US 10,915,676 B2
(45) Date of Patent: Feb. 9, 2021

(54) RECERTIFICATION OF AN INTERACTIVE COMPUTER SIMULATION STATION

(71) Applicant: CAE Inc., Saint-Laurent (CA)

(72) Inventors: Louis Lamontagne, Saint-Laurent (CA); Michael Gordon, Montreal (CA); Jonathan Dore, Mascouche (CA); Gregory Chorkawy, Notre-Dame-de-L'Île-Perrot (CA)

(73) Assignee: CAE Inc., St-Laurent (CA)

( * ) Notice: Subject to any disclaimer, the term of this patent is extended or adjusted under 35 U.S.C. 154(b) by 357 days.

(21) Appl. No.: 15/941,894

(22) Filed: Mar. 30, 2018

(65) Prior Publication Data

US 2020/0143092 A1    May 7, 2020

(51) Int. Cl.
*G06F 30/20*    (2020.01)

(52) U.S. Cl.
CPC .................... *G06F 30/20* (2020.01)

(58) Field of Classification Search
CPC .............. G06F 30/20; G09B 9/08; G09B 9/00
USPC ...................................................... 703/2, 7–8
See application file for complete search history.

(56) References Cited

U.S. PATENT DOCUMENTS

| | | | |
|---|---|---|---|
| 7,107,196 B2 | 9/2006 | Waterston | |
| 2011/0246160 A1* | 10/2011 | Cloury | G09B 9/08 703/8 |
| 2012/0053916 A1* | 3/2012 | Tzidon | G09B 9/08 703/8 |
| 2015/0079545 A1 | 3/2015 | Kurtz | |

(Continued)

FOREIGN PATENT DOCUMENTS

| | | |
|---|---|---|
| CA | 2963115 | 5/2017 |
| CA | 2963112 | 6/2017 |

(Continued)

OTHER PUBLICATIONS

McGovern et al. "Categories for Classification of Aircraft Flight Model Validation". 26th Digital Avionics Systems Conference Oct. 21, 2007. 9 Pages. (Year: 2007).*

(Continued)

*Primary Examiner* — Eunhee Kim
(74) *Attorney, Agent, or Firm* — Benoit Yelle; Gowling WLG (Canada) LLP

(57) ABSTRACT

A method and system for recertifying an interactive computer simulation station from certification rules provided by an authoritative source. A baseline results of the station, generated upon certification thereof is obtained. While executing a simulation in the station, tangible instruments are stimulated in real-time for generating subsequent test results. Deviated parameters are identified with a test result incompliant with a target value. For the deviated parameters, a previously certified deviated value is obtained from the baseline results. A previously accepted deviation value is computed. A challenged deviation value is computed between the test result value, the target value and the baseline value. A delta deviation value is computed between the previously accepted deviation value and the challenged deviation value. When the delta deviation value is within the acceptable deviation range, the deviated parameter is identified as an equivalent parameter and the original justification from the baseline results is associated therewith.

20 Claims, 3 Drawing Sheets

(56) References Cited

U.S. PATENT DOCUMENTS

2015/0262512 A1  9/2015  Rios et al.
2016/0358498 A1  12/2016  Fucke et al.

FOREIGN PATENT DOCUMENTS

| CN | 102132294 | 11/2014 |
| CN | 206162925 | 5/2017 |
| JP | 3131887 | 2/2001 |
| JP | 4413333 | 2/2010 |
| JP | 5362744 | 12/2013 |
| KR | 1634291 | 7/2016 |
| RU | 2111698 | 5/1998 |
| WO | 2017165946 | 10/2017 |

OTHER PUBLICATIONS

Mhenni et al. "Flight Control System Modeling with SysML to Support Validation, Qualificationand Certification". IFAC—PapersOnLine 49-3 (2016) pp. 453-458 (Year: 2016).*

"Aeroplane Flight Simulator Evaluation Handbook". Third Edition Jun. 2005. Digitally printed by Colurtech, Ashford, Kent. 551 Pages. (Year: 2005).*

European Search Report for corresponding EP application No. 19166043.0, dated Sep. 16, 2019.

* cited by examiner

RECERTIFICATION OF AN INTERACTIVE COMPUTER SIMULATION STATION

TECHNICAL FIELD

The present invention relates to interactive computer simulation systems and more particularly to certification of an interactive computer-based simulation station for training purposes.

BACKGROUND

An interactive computer simulation system performs one or more interactive computer simulations. Each interactive computer simulation comprises one or more virtual simulated elements each representing an actual system (e.g., multiple virtual aircraft systems each representing an actual aircraft). Each interactive computer simulation provides a virtual environment and various tangible instruments (or controls) to allow enactment of different scenarios for the purpose of training one or more users (or trainees), using one or more of the virtual simulated elements, in the operation and/or understanding of the corresponding one or more actual systems. The virtual simulated element, or simulated element, is defined herein as a simulated system, and may further comprise multiple simulated dynamic subsystems, or dynamic subsystems. The simulated element is a virtual version that simulates, to the extent required by the interactive computer simulation, behavior of an actual system. Correspondingly, each of the simulated dynamic subsystems of the simulated element is a virtual version, to the extent required but the interactive computer simulation, behavior of actual subsystems of the actual system. The various tangible instruments accessible to the one or more users replicate actual instruments or otherwise reproduce behavior of the actual instruments found in the actual system.

By way of example, a Qualification Test Guide (QTG) is a guide for certifying new flight simulation technology to one of many regulatory levels of the appropriate national or regional regulatory authoritative source. A QTG provides a list of tests that are necessary to qualify a flight simulator for use. Authoritative sources that utilize QTGs include the Federal Aviation Administration (FAA) in the USA, the National Civil Aviation Agency (ANAC) in Brazil, the European Aviation Safety Agency (EASA) in the European Union and equivalent sources in other countries. Some international QTGs are published by the International Civil Aviation Organization (ICAO) and some have been drafted as a result of international working groups chaired by the London-based Flight Simulation Group of the Royal Aeronautical Society, the latter acting as an international "honest broker." The evaluation of aeroplane simulators for qualification under the "International Standards for the Qualification of Airplane Flight Simulators" developed by the Royal Aeronautical Society and amended by the $2^{nd}$ Edition of the ICAO "Manual of Criteria for the Qualification of Flight Simulators" is a complex and demanding technical task.

Certifying a computer-based interactive computer simulation station is also critical in environments other than aircraft simulators to ensure that the training provided thereby is of sufficient quality (e.g., healthcare-related simulators, land and marine vehicle simulators, etc.).

Performing the tests required for certification and subsequently determining whether the behavior of a computer-based interactive computer simulation station in a given area is proper currently necessitates a lot of human and computing resources.

The present invention at least partially addresses this concern.

SUMMARY

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with a first aspect, the invention is directed to a method for recertifying an interactive computer simulation station from certification rules provided by an authoritative source. The interactive computer simulation station executes an interactive computer simulation comprising a plurality of interrelated parameters defining a dynamic behavior of a simulated interactive object, in an interactive computer simulation environment, when inputs are provided on one or more tangible instruments of the interactive computer simulation station. The method comprises obtaining baseline results of the interactive computer simulation station, generated upon certification thereof by the authoritative source, for each of the interrelated parameters. The method also comprises, while executing the interactive computer simulation in the interactive computer simulation station, stimulating one or more tangible instruments in real-time for generating subsequent test results for each of the interrelated parameters. Following the generation of the subsequent test results, the method comprises identifying one or more deviated parameters for which a test result value is incompliant with a target value provided in the certification rules. The method then comprises, for each one of the deviated parameters, obtaining a previously certified deviated value corresponding to a baseline value from the baseline results for the one deviated parameter, computing a previously accepted deviation value between the previously certified deviated value and the target value from the certification rules, computing a challenged deviation value between the test result value and the target value from the certification rules the baseline value and computing a delta deviation value between the previously accepted deviation value and the challenged deviation value. When the delta deviation value is outside of an acceptable deviation range, the one deviated parameter is identified as a challenged parameter (e.g., for which a corrective action or a new justification will need to be provided or an original justification updated). When the delta deviation value is within the acceptable deviation range, the one deviated parameter is identified as an equivalent parameter and the original justification for the previously certified deviated value from the baseline results is associated with the one deviated parameter.

The method may optionally comprise submitting the subsequent test results with any original justifications for recertifying the interactive computer simulation station with the authoritative source when no challenged parameter is identified.

The method may optionally comprise, when the one deviated parameter is identified as a challenged parameter, identifying one or more of the tangible instruments as possibly defective. In this example, the method may further comprise, following revision of the one or more of the tangible instruments identified as possibly defective, restimulating the one or more tangible instruments in real-time for generating additional test results for each of the interrelated parameters. The method may then yet further comprise submitting the additional test results with any original justifications for recertifying the interactive computer simulation station when no challenged parameter is identified following from the generated additional test results.

In some embodiments, the authoritative source comprises at least one of the Federal Aviation Administration (FAA) in the USA, the National Civil Aviation Agency (ANAC) in Brazil, the European Aviation Safety Agency (EASA) in the European Union or Transport Canada. Qualification Test Guide (QTG) methodology may be used for generating the baseline results and the subsequent test results. The simulated interactive object may be a simulated aircraft and the plurality of interrelated parameters comprises a drag value, a side-force value, a lift value, a pitch value, a roll value, a yaw value and a power profile and a plurality of simulated constraints associated to the computer generated environment comprises gravitational force and atmospheric pressure.

Optionally, the method may further comprise directly identifying one or more of the plurality of interrelated parameters as a challenged parameter when corresponding testing methodology is incompatible with the baseline results. Likewise, in addition or alternatively, the method may optionally comprise directly identifying one or more of the plurality of interrelated parameters as a challenged parameter when a corresponding target value is incompatible with the baseline results.

In accordance with a second aspect, the invention is directed to a computer system for recertifying an interactive computer simulation station from certification rules provided by an authoritative source. The interactive computer simulation station executes an interactive computer simulation comprising a plurality of interrelated parameters defining a dynamic behavior of a simulated interactive object, in an interactive computer simulation environment, when inputs are provided on one or more tangible instruments. The computer system comprises one or more storage systems and a processor module.

The one or more storage systems is for storing the certifications rules provided by the authoritative source; and storing baseline results of the interactive computer simulation station, generated upon certification thereof by the authoritative source, for each of the interrelated parameters. The tangible instruments are stimulated, while executing the interactive computer simulation, in real-time for generating subsequent test results for each of the interrelated parameters, the subsequent test results being stored in the one or more storage systems; and The processor module identifies one or more deviated parameters for which a test result value is incompliant with a target value provided in the certification rules. The processor module, for each one of the deviated parameters, obtains a previously certified deviated value corresponding to a baseline value from the baseline results for the one deviated parameter, computes a previously accepted deviation value between the previously certified deviated value and the target value from the certification rules, computes a challenged deviation value between the test result value and the target value from the certification rules the baseline value and computes a delta deviation value between the previously accepted deviation value and the challenged deviation value.

When the delta deviation value is outside of an acceptable deviation range, the processor module identifies the one deviated parameter as a challenged parameter. When the delta deviation value is within the acceptable deviation range, the processor module identifies the one deviated parameter as an equivalent parameter and associates an original justification for the previously certified deviated value from the baseline results with the one deviated parameter.

The processor module may further submit the subsequent test results with any original justifications for recertifying the interactive computer simulation station when no challenged parameter is identified.

In some embodiments, when the one deviated parameter is identified as a challenged parameter, one or more of the tangible instruments is identified as possibly defective. The one or more tangible instruments identified as possibly defective, following revision thereof, may further be restimulated in real-time for generating additional test results for each of the interrelated parameters. The processor module may further submit the additional test results with any original justifications for recertifying the interactive computer simulation station when no challenged parameter is identified following from the generated additional test results.

The authoritative source may comprise at least one of the Federal Aviation Administration (FAA) in the USA, the National Civil Aviation Agency (ANAC) in Brazil, the European Aviation Safety Agency (EASA) in the European Union or Transport Canada.

Qualification Test Guide (QTG) methodology may be used for generating the baseline results and the subsequent test results. The simulated interactive object may be a simulated aircraft and the plurality of interrelated parameters may then comprise a drag value, a side-force value, a lift value, a pitch value, a roll value, a yaw value and a power profile and a plurality of simulated constraints associated to the computer generated environment comprises gravitational force and atmospheric pressure.

The processor module may further directly identify one or more of the plurality of interrelated parameters as a challenged parameter when corresponding testing methodology is incompatible with the baseline results.

The processor module may further directly identify one or more of the plurality of interrelated parameters as a challenged parameter when a corresponding target value is incompatible with the baseline results.

BRIEF DESCRIPTION OF THE DRAWINGS

Further features and exemplary advantages of the present invention will become apparent from the following detailed description, taken in conjunction with the appended drawings, in which.

DETAILED DESCRIPTION

Figure 1:
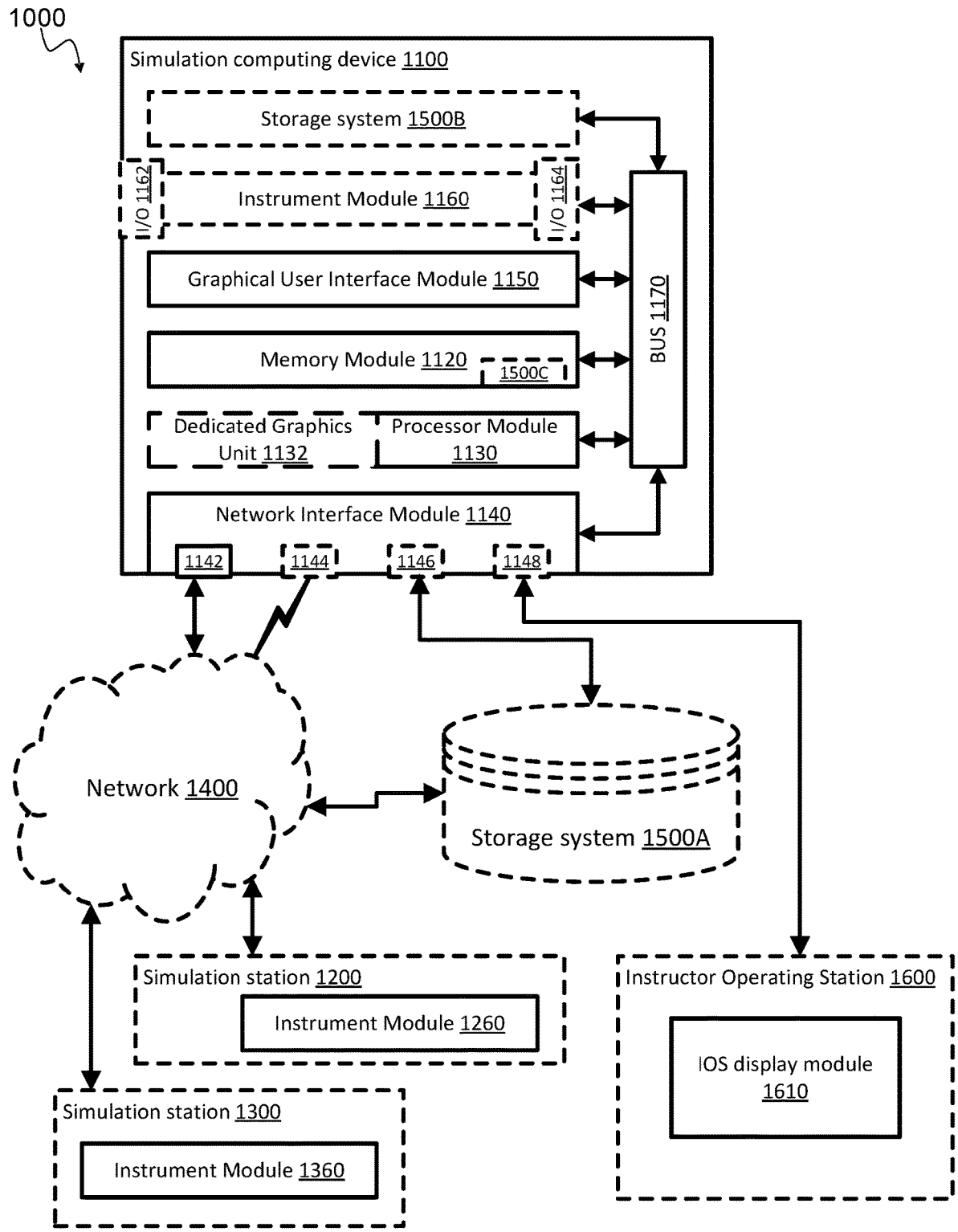
FIG. 1 is a logical modular representation of an exemplary simulation computing device in accordance with the teachings of the present invention.

In the context of aircraft simulators, various tests are completed for comparing a given simulator performance with an actual aeroplane performance. The simulator performance must be within specified tolerances for the tests to be considered successful and for the simulator to be certified for training. Such tests are performed initially to certify the simulator (i.e., before the simulator being used as a training device) and subsequently, e.g., to ensure continued performance of the simulator. The initial certification takes place following an initial series of tests and consist in comparing the tests results with the reference target values (or reference values) provided by an authoritative source (e.g., the International Civil Aviation Organization (ICAO) for aircraft simulators). Nowadays, an operator of the simulator (i.e., a person or group of persons) spends enough time, typically tens of hours, analysing the test results. Every discrepancy between the test results and the reference values leads to a corrective action in the simulator or, whenever relevant, is justified by the operator. The certification of the simulator is provided by the authoritative source only when any discrepancy can be satisfactorily justified. The certification is valid for a certain period of time.

In order to be recertified (i.e., near the end of the certification period), the operator needs to demonstrate, to the satisfaction of the authoritative source, that simulator performance still meets the target reference values. The configuration control system used by the operator of the simulator is also typically verified (e.g., log of issues that occurred during simulation, log of updates performed or to be performed, etc.). A subsequent series of tests is performed on the simulator and provides subsequent test results. The certification is reconfirmed only when the simulator performance, as illustrated through the subsequent test results, is still acceptable to the authoritative source. Nowadays, the operator of the simulator spends enough time, typically tens of hours, analysing the subsequent test results. Every discrepancy between the subsequent test results and the reference values leads to a corrective action in the simulator or, whenever relevant, is justified by the operator. The recertification of the simulator is provided by the authoritative source only when any discrepancy can be satisfactorily justified. The recertification is valid for a certain period of time.

In accordance with the teachings of the present invention, the initial test results (i.e., that were used and justified to obtain the initial certification) are used to define baseline results for the certified simulator. The baseline results, which have been considered acceptable to authoritative source as of the date of initial certification, are thereafter used to enhance the review of the subsequent test results. One could say that when the subsequent test results are equivalent to the baseline results, the subsequent test results should be considered acceptable as well. However, in some circumstances, the authoritative source might change the manner in which the test results are evaluated. Likewise, modelling of the simulated system in the simulator might have evolved between certification and attempted recertification leading to updated target values. Furthermore, the manner in which the test results are generated by the operator might also have changed during the same period. Typically, such changes to modelling and/or testing methodology have been discussed and agreed with the authoritative source. Therefore, deviations in the subsequent test results, in most cases, can still be adapted such that the subsequent test results become comparable to the baseline results and the authoritative source's target values. Some of the subsequent test results, however, may still require the usual analysis, for instance, when there does not exist a justification in the baseline result for an equivalent deviation, when the justification is not applicable to the deviation from the subsequent test results, when the target values and/or the subsequent results (e.g., from updated testing methodology) cannot be reconciled, when the subsequent results has no equivalent in the baseline results (new measurement from updated testing methodology), etc.

In an interactive computer simulation, a computer generated environment is provided with different structures and certain sets of rules. For example, the computer generated environment might comprise buildings, streets, airports, lakes, rivers, etc. as well as, in addition or alternatively, in-building structures (e.g., emergency or surgical rooms), control panels, cockpit, confined spaces (e.g., spacecraft or submarine), etc. In terms of exemplary rules, the computer generated environment may specify a constant gravitational force value and a variable air pressure value that varies as a function of altitude in the computer generated environment. Of course, as skilled persons will readily recognize, the gravitational force value may also be set as a function of distance to one or more planets or objects, which would be critical if the interactive computer simulation was related to space travel. Many other rules are also set in the interactive computer simulation (e.g., weather parameters, parameterized lighting conditions, etc.), which may be set to replicate a realistic environment, an expected environment or a fictitious one, depending on the context of the interactive computer simulation. The computer generated environment may also comprise other dynamic representations (e.g., simulated moving vehicles, simulated humans, etc.). The interactive computer simulation also comprises one or more simulated interactive objects controlled by at least one user of the interactive computer simulation. For instance, the simulated interactive object may be a vehicle (e.g., airplane, helicopter, spacecraft, tank, etc.), a human (e.g., a patient in a hospital), a control panel (e.g., from a nuclear central, air traffic controller station), etc. A physical instrument module is provided for the user to control the simulated interactive object in the interactive computer simulation using one or more tangible instruments. It is often difficult to identify defective tangible instruments, maintain tangible instruments being used in simulators and/or repair defective tangible instruments as the effect of a defective or improper tangible instruments on the simulated behavior of the simulated object is most often not readily identifiable.

The simulated interactive object is defined by a model in the interactive computer simulation. The model sets the capacity and characteristics of the simulated interactive object in the computer generated environment. For instance, in the case of a simulated airplane, the corresponding model sets the lift force at different airspeed considering the airplane angle of attack in the air and flap position. Of course, many other parameters also define how the simulated airplane must behave in the interactive computer simulation. The model for the interactive simulated object contains a plurality of interrelated parameters. That is, the value of a single parameter defines many aspects of the simulated behavior of the simulated object. As such, setting one value for one of the model parameters has an impact on many aspects of the simulated behavior of the interactive object in the interactive computer simulation. It is difficult to identify defective models, maintain models being used in simulators and/or repair defective models as the effect of a defective or improper parameters on the simulated behavior of the simulated object is most often not be readily identifiable.

In the context of training provided by interactive computer flight simulators stations, an accurate representation of a flying aircraft is required with the fidelity and realism to affect a positive standard of behavior in flight crews. Qualification Test Guides (QTGs) are the method currently used to ensure the device provides a proper experience when put in service and also remains faithful to the original design and qualification data. However, the QTGs require the simulator stations to be taken offline for an extended period of time (e.g., 3 to 4 hours). Furthermore, even when one or more of the tests established by the QTGs fail, the faulty element of the simulator station is not necessarily identified.

While the present invention was mostly envisioned as a complement to the QTGs related to flight simulators, the teachings and findings are applicable in various situations where an interactive computer simulation is implemented through a model and further requires tangible instruments provided to a user to interact therein from an interactive computer simulation station.

In the context of aircraft modeling used on flight simulator stations, the tangible instruments of the flight simulator station may be stimulated to perform defined maneuvers at different speeds (e.g., different flight regimes at different altitudes) and along different axes (longitudinal, lateral, directional and vertical), which allow capturing and storing of desirable measurements, The stimulation provided to the tangible instruments provide a real-time response (from real-time execution or real-time priority processing as defined hereinbelow) from the flight simulator stations and the desirable measurements are therefor also generated in real-time.

The interactive computer simulation may, for instance, be used for training purposes and/or for enacting a scenario from historical data (e.g., from a recording of a surgical procedure, from an event recording device (e.g., black box) from an aircraft, a train, etc.). The interactive computer simulation may be scenario-based (e.g., where simulation code driving the interactive computer generated environment comprises one or more predetermined events, motions, sounds, etc.).

The interactive computer simulation may perform a training simulation program such as a flight simulation software or a healthcare simulation software. The computer generated environment is related to subject-matter of the training provided through the interactive computer simulation (e.g., a virtual representation of a real or fictional region of the world, a virtual representation of a real or fictional hospital) where the interactive computer simulation can take place (e.g., the Greater Montreal area with a detailed representation of at least some of its airports or a fully-equipped operating room from Hospital Ste-Justine de Montreal). The interactive computer simulation may also be related to a vehicle interactive computer simulation involving one or more simulated vehicle(s). The interactive computer simulation may be a (e.g., single or multiple vehicles simultaneously). The present invention is not limited by the type of interactive simulated vehicle, which may be terrestrial (car, tank, etc.), underground, airborne (e.g., an aircraft, a space shuttle), floating (e.g., a boat), etc. The interactive computer simulation may also be related to a game, which could differ from the training simulation because of the different rules that apply in the computer generated environment (e.g., varying gravity force, presence of unrealistic elements (force fields), varying response to damages, varied capacity to undo or affect past actions, success measured on different results, etc.).

Reference is now made to the drawings in which FIG. 1 shows a logical modular representation of an exemplary interactive computer simulation system 1000 providing a model associated to a simulated interactive object of an interactive computer simulation, in accordance with the teachings of the present invention. The interactive computer simulation system 1000 comprises a simulation computing device 1100. In some embodiments, the simulation computing device 1100 is an interactive computer simulation station, which may execute one or more interactive computer simulations such as a flight simulation software instance or a healthcare simulation software instance.

In the depicted example of FIG. 1, the simulation computing device 1100 comprises a memory module 1120, a processor module 1130 and a network interface module 1140. The processor module 1130 may represent a single processor with one or more processor cores or an array of processors, each comprising one or more processor cores. In some embodiments, the processor module 1130 may also comprise a dedicated graphics processing unit 1132. The dedicated graphics processing unit 1132 may be required, for instance, when the interactive computer simulation system 1000 performs an immersive simulation (e.g., pilot training-certified flight simulator), which requires extensive image generation capabilities (i.e., quality and throughput) to maintain expected realism of such immersive simulation (e.g., between 5 and 60 images rendered per seconds or maximum between 15 ms and 200 ms for each rendered image). In some embodiments, each of the simulation stations 1200, 1300 comprise a processor module having a dedicated graphics processing unit similar to the dedicated graphics processing unit 1132. The memory module 1120 may comprise various types of memory (different standardized or kinds of Random Access Memory (RAM) modules, memory cards, Read-Only Memory (ROM) modules, programmable ROM, etc.). The network interface module 1140 represents at least one physical interface that can be used to communicate with other network nodes. The network interface module 1140 may be made visible to the other modules of the simulation computing device 1100 through one or more logical interfaces. The actual stacks of protocols used by the physical network interface(s) and/or logical network interface(s) 1142, 1144, 1146, 1148 of the network interface module 1140 do not affect the teachings of the present invention. The variants of processor module 1130, memory module 1120 and network interface module 1140 usable in the context of the present invention will be readily apparent to persons skilled in the art.

A bus 1170 is depicted as an example of means for exchanging data between the different modules of the simulation computing device 1100. The present invention is not affected by the way the different modules exchange information between them. For instance, the memory module 1120 and the processor module 1130 could be connected by a parallel bus, but could also be connected by a serial connection or involve an intermediate module (not shown) without affecting the teachings of the present invention.

Likewise, even though explicit mentions of the memory module 1120 and/or the processor module 1130 are not made throughout the description of the various embodiments, persons skilled in the art will readily recognize that such modules are used in conjunction with other modules of the simulation computing device 1100 to perform routine as well as innovative steps related to the present invention.

The simulation computing device 1100 also comprises a Graphical User Interface (GUI) module 1150 comprising one or more display screen(s). The display screens of the GUI module 1150 could be split into one or more flat panels, but could also be a single flat or curved screen visible from an expected user position (not shown) in the simulation computing device. For instance, the GUI module 1150 may comprise one or more mounted projectors for projecting images on a curved refracting screen. The curved refracting screen may be located far enough from the user of the interactive computer program to provide a collimated display. Alternatively, the curved refracting screen may provide a non-collimated display.

The interactive computer simulation system 1000 comprises a storage system 1500 that may log dynamic data in relation to the dynamic sub-systems while the interactive computer simulation is performed. FIG. 1 shows examples of the storage system 1500 as a distinct database system 1500A, a distinct module 1500B of the simulation computing device 1100 or a sub-module 1500C of the memory module 1120 of the simulation computing device 1100. The storage system 1500 may also comprise storage modules (not shown) on the simulation stations 1200, 1300. The storage system 1500 may be distributed over different systems A, B, C and/or the simulations stations 1200, 1300 or may be in a single system. The storage system 1500 may comprise one or more logical or physical as well as local or remote hard disk drive (HDD) (or an array thereof). The storage system 1500 may further comprise a local or remote database made accessible to the computer system 1100 by a standardized or proprietary interface or via the network interface module 1140. The variants of storage system 1500 usable in the context of the present invention will be readily apparent to persons skilled in the art.

An Instructor Operating Station (IOS) 1600 may be provided for allowing various management tasks to be performed in the interactive computer simulation system 1000. The tasks associated with the IOS 1600 allow for control and/or monitoring of one or more ongoing interactive computer simulations. For instance, the IOS 1600 may be used for allowing an instructor to participate to the interactive computer simulation and possibly additional interactive computer simulation(s). In some embodiments, the IOS may be provided by the simulation computing device. In other embodiments, the IOS may be co-located with the simulation computing device (e.g., within the same room or simulation enclosure) or remote therefrom (e.g., in different rooms or in different locations). Skilled persons will understand the many instances of the IOS 1600 may be concurrently provided in the interactive computer simulation system 1000. The IOS 1600 may provide a computer simulation management interface, which may be displayed on a dedicated IOS display module 1610 or the GUI module 1150. The IOS 1600 could be located in close proximity with the simulation computing device, but may also be provided outside of the simulation computing device 1100, in communication therewith.

The IOS display module 1610 may comprise one or more display screens such as a wired or wireless flat screen, a wired or wireless touch-sensitive display, a tablet computer, a portable computer or a smart phone. When multiple computing devices 1100 and/or stations 1200, 1300 are present in the computer system 1000, the IOS 1600 may present different views of the computer program management interface (e.g., to manage different aspects therewith) or they may all present the same view thereof. The computer program management interface may be permanently shown on a first of the screens of the IOS display module 1610 while a second of the screen of the IOS display module 1610 shows a view of the interactive computer simulation (i.e., adapted view considering the second screen from images displayed through the display module 1150). The computer program management interface may also be triggered on the IOS 1600, e.g., by a touch gesture and/or an event in the interactive computer program (e.g., milestone reached, unexpected action from the user, or action outside of expected parameters, success or failure of a certain mission, etc.). The computer program management interface may provide access to settings of the interactive computer simulation and/or of the simulation computing device. A virtualized IOS (not shown) may also be provided to the user on the GUI module 1150 (e.g., on a main screen, on a secondary screen or a dedicated screen thereof). In some embodiments, a Brief and Debrief System (BDS) may also be provided. The BDS may be seen as a version of the IOS 1600 used during playback of recorded data only.

The tangible instrument provided by the instrument modules 1160, 1260 and/or 1360 are tightly related to the element being simulated. In the example of the simulated aircraft system, for instance in relation to an exemplary flight simulator embodiment, the instrument module 1160 may comprise a control yoke and/or side stick, rudder pedals, a throttle, a flap switch, a transponder, a landing gear lever, a parking brake switch, aircraft instruments (air speed indicator, attitude indicator, altimeter, turn coordinator, vertical speed indicator, heading indicator, . . . ), etc. Depending on the type of simulation (e.g., level of immersivity), the tangible instruments may be more or less realistic compared to those that would be available in an actual aircraft. For instance, the tangible instrument provided by the modules 1160, 1260 and/or 1360 may replicate an actual aircraft cockpit where actual instruments found in the actual aircraft or physical interfaces having similar physical characteristics are provided to the user (or trainee). As previously described, the actions that the user or trainee takes with one or more of the tangible instruments provided via the instrument module(s) 1160, 1260 and/or 1360 (modifying lever positions, activating/deactivating switches, etc.) allow the user or trainee to control the virtual simulated element in the interactive computer simulation. In the context of an immersive simulation being performed in the interactive computer simulation system 1000, the instrument module 1160, 1260 and/or 1360 would typically support a replicate of an actual instrument panel found in the actual system being the subject of the immersive simulation. In such an immersive simulation, the dedicated graphics processing unit 1132 would also typically be required. While the present invention is applicable to immersive simulations (e.g., flight simulators certified for commercial pilot training and/or military pilot training), skilled persons will readily recognize and be able to apply its teachings to other types of interactive computer simulations.

In some embodiments, an optional external input/output (I/O) module 1162 and/or an optional internal input/output (I/O) module 1164 may be provided with the instrument module 1160. Skilled people will understand that any of the instrument modules 1160, 1260 and/or 1360 may be provided with one or both of the I/O modules such as the ones depicted for the simulation computing device 1100. The external input/output (I/O) module 1162 of the instrument module 1160, 1260 and/or 1360 may connect one or more external tangible instruments (not shown) therethrough. The external I/O module 1162 may be required, for instance, for interfacing the interactive computer simulation system 1000 with one or more tangible instrument identical to an Original Equipment Manufacturer (OEM) part that cannot be integrated into the simulation computing device 1100 and/or the simulation station(s) 1200, 1300 (e.g., a tangible instrument exactly as the one that would be found in the actual system subject of the interactive simulation). The internal input/output (I/O) module 1164 of the instrument module 1160, 1260 and/or 1360 may connect one or more tangible instruments integrated with the instrument module 1160, 1260 and/or 1360. The I/O 1164 may comprise necessary interface(s) to exchange data, set data or get data from such integrated tangible instruments. The internal I/O module 1164 may be required, for instance, for interfacing the interactive computer simulation system 1000 with one or more integrated tangible instrument identical to an Original Equipment Manufacturer (OEM) part (e.g., a tangible instrument exactly as the one that would be found in the actual system subject of the interactive simulation). The I/O 1164 may comprise necessary interface(s) to exchange data, set data or get data from such integrated tangible instruments.

The instrument module 1160 may comprise one or more physical module that may further be interconnected to provide a given configuration of the interactive computer program. As can be readily understood, instruments of the instrument module 1160 are expected to be manipulated by the user of the interactive computer simulation to input commands thereto.

The instrument module 1160 may yet also comprise a mechanical instrument actuator (not shown) providing one or more mechanical assemblies for physical moving one or more of the tangible instruments of the instrument module 1160 (e.g., electric motors, mechanical dampeners, gears, levers, etc.). The mechanical instrument actuator may receive one or more sets of instructions (e.g., from the processor module 1130) for causing one or more of the instruments to move in accordance with a defined input function. The mechanical instrument actuator of the instrument module 1160 may also alternatively or in addition be used for providing feedback to the user of the interactive computer simulation through tangible and/or simulated instrument(s) (e.g., touch screens, or replicated elements of an aircraft cockpit or of an operating room). Additional feedback devices may be provided with the simulation computing device 1110 or in the interactive computer simulation system 1000 (e.g., vibration of an instrument, physical movement of a seat of the user and/or physical movement of the whole system, etc.).

The simulation computing device may also comprise one or more seats (not shown) or other ergonomically designed tools (not shown) to assist the user of the interactive computer simulation in getting into proper position to gain access to some or all of the instrument module 1160.

In the depicted example of FIG. 1, the interactive computer simulation system 1000 shows optional interactive computer simulation stations 1200, 1300, which may communicate through the network 1400 with the simulation computing device. The stations 1200, 1300 may be associated to the same instance of the interactive computer simulation with a shared computer generated environment where users of the simulation computing device 1100 and stations 1200, 1300 may interact with one another in a single simulation. The single simulation may also involve other simulation computing device(s) (not shown) co-located with the simulation computing device or remote therefrom. The simulation computing device and stations 1200, 1300 may also be associated with different instances of the interactive computer simulation, which may further involve other simulation computing device(s) (not shown) co-located with the simulation computing device or remote therefrom.

In the context of the depicted embodiments, runtime execution, real-time execution or real-time priority processing execution corresponds to operations executed during the interactive computer simulation that may have an impact on the perceived quality of the interactive computer simulation from a user perspective. An operation performed at runtime, in real-time or using real-time priority processing thus typically needs to meet certain performance constraints that may be expressed, for instance, in terms of maximum time, maximum number of frames, and/or maximum number of processing cycles. For instance, in an interactive simulation having a frame rate of 60 frames per second, it is expected that a modification performed within 5 to 10 frames will appear seamless to the user. Skilled persons will readily recognize that real-time processing may not actually be achievable in absolutely all circumstances in which rendering images is required. The real-time priority processing required for the purpose of the disclosed embodiments relates to perceived quality of service by the user of the interactive computer simulation, and does not require absolute real-time processing of all dynamic events, even if the user was to perceive a certain level of deterioration of quality of service that would still be considered plausible.

A simulation network (e.g., overlaid on the network 1400) may be used, at runtime (e.g., using real-time priority processing or processing priority that the user perceives as real-time), to exchange information (e.g., event-related simulation information). For instance, movements of a vehicle associated to the simulation computing device 1100 and events related to interactions of a user of the simulation computing device 1100 with the interactive computer generated environment may be shared through the simulation network. Likewise, simulation-wide events (e.g., related to persistent modifications to the interactive computer generated environment, lighting conditions, modified simulated weather, etc.) may be shared through the simulation network from a centralized computer system (not shown). In addition, the storage module 1500 (e.g., a networked database system) accessible to all components of the interactive computer simulation system 1000 involved in the interactive computer simulation may be used to store data necessary for rendering interactive computer generated environment. In some embodiments, the storage module 1500 is only updated from the centralized computer system and the simulation computing device and stations 1200, 1300 only load data therefrom.

Figure 2:
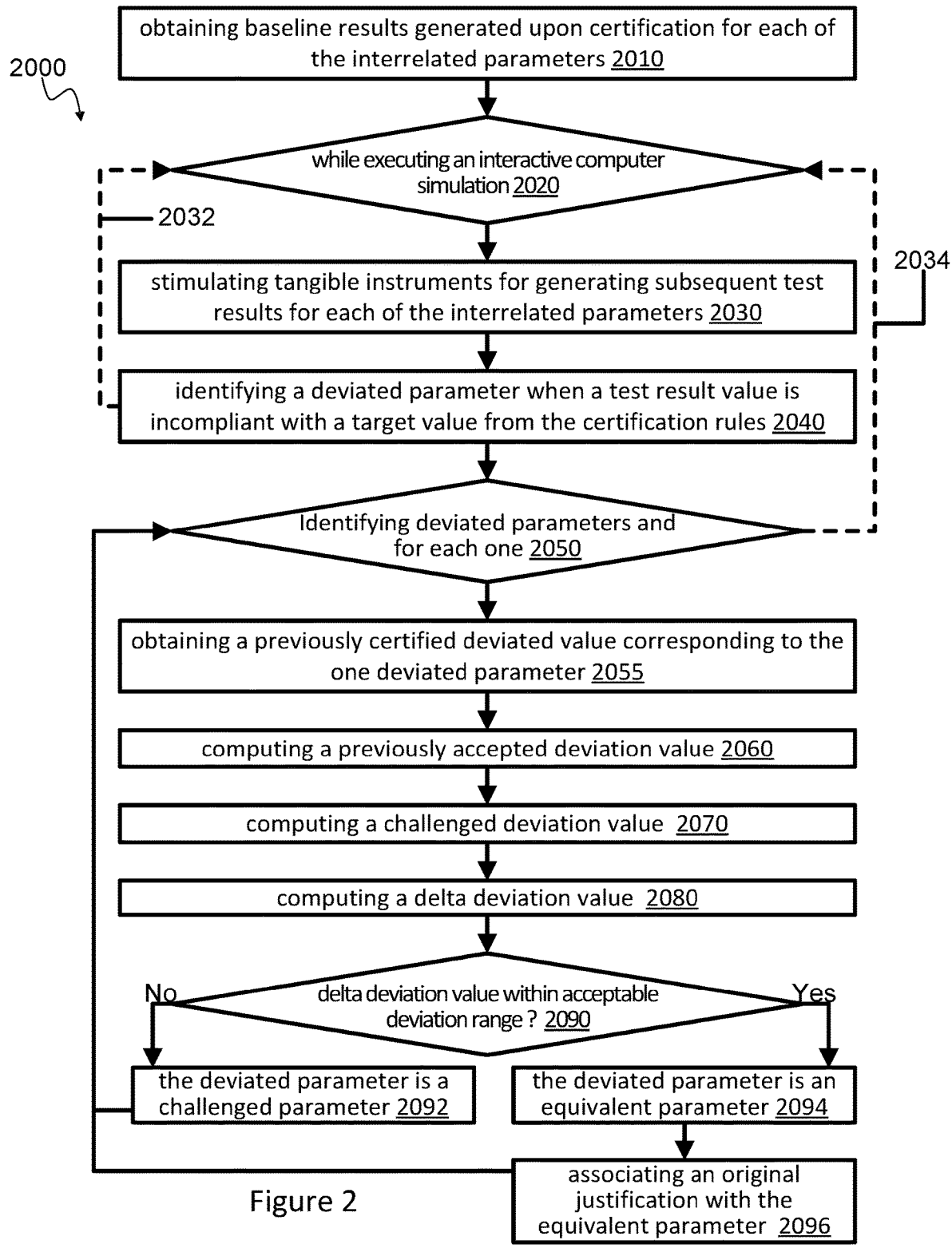
FIG. 2 is a flow chart of a first exemplary method in accordance with the teachings of the present invention.

FIG. 2 provides a flow chart of an exemplary method 2000, performed completely or partially by the processor module 1130 using the memory module 1120, for recertifying an interactive computer simulation station 1100 from certification rules provided by an authoritative source. The interactive computer simulation station 1100 executes an interactive computer simulation (e.g., performed by the processor module 1130 using the memory module 1120) comprising a plurality of interrelated parameters defining a dynamic behavior of a simulated interactive object, in an interactive computer simulation environment, when inputs are provided on one or more tangible instruments 1160 of the interactive computer simulation station 1100.

The method 2000 comprises obtaining 2010 baseline results of the interactive computer simulation station 1100, generated upon certification thereof by the authoritative source, for each of the interrelated parameters (e.g., from the storage system 1500 through the network interface 1140). The method 2000 also comprises, while executing 2020 the interactive computer simulation in the interactive computer simulation station 1100, stimulating 2030 one or more tangible instruments 1160 in real-time for generating subsequent test results for each of the interrelated parameters (e.g., using one or more mechanical instrument actuators). Following the generation 2030 of the subsequent test results, the method 2000 comprises identifying 2040 one or more deviated parameters for which a test result value is incompliant with a target value provided in the certification rules. The method 2000 then comprises, for each one of the deviated parameters 2050, obtaining 2055 a previously certified deviated value corresponding to a baseline value from the baseline results for the one deviated parameter, computing 2060 a previously accepted deviation value between the previously certified deviated value and the target value from the certification rules, computing 2070 a challenged deviation value between the test result value and the target value from the certification rules the baseline value and computing 2080 a delta deviation value between the previously accepted deviation value and the challenged deviation value. When 2090 the delta deviation value is outside of an acceptable deviation range, the one deviated parameter is identified 2092 as a challenged parameter (e.g., for which a corrective action or a new justification will need to be provided or an original justification updated). When 2090 the delta deviation value is within the acceptable deviation range, the one deviated parameter is identified 2084 as an equivalent parameter and the original justification for the previously certified deviated value from the baseline results is associated 2096 with the one deviated parameter.

The method 200 may optionally comprise submitting the subsequent test results with any original justifications for recertifying the interactive computer simulation station 1100 with the authoritative source when no challenged parameter is identified.

The method 2000 may optionally comprise, when the one deviated parameter is identified as a challenged parameter, identifying one or more of the tangible instruments 1160 as possibly defective. In this example, the method 2000 may further comprise, following revision of the one or more of the tangible instruments 1160 identified as possibly defective, restimulating the one or more tangible instruments 1160 in real-time for generating additional test results for each of the interrelated parameters. The method 2000 may then yet further comprise submitting the additional test results with any original justifications for recertifying the interactive computer simulation station 1100 when no challenged parameter is identified following from the generated additional test results.

The simulated interactive object may be a simulated aircraft and the plurality of interrelated parameters may then comprise a drag value, a side-force value, a lift value, a pitch value, a roll value, a yaw value and a power profile and a plurality of simulated constraints may be associated to the computer generated environment such as gravitational force and atmospheric pressure.

Figure 3:
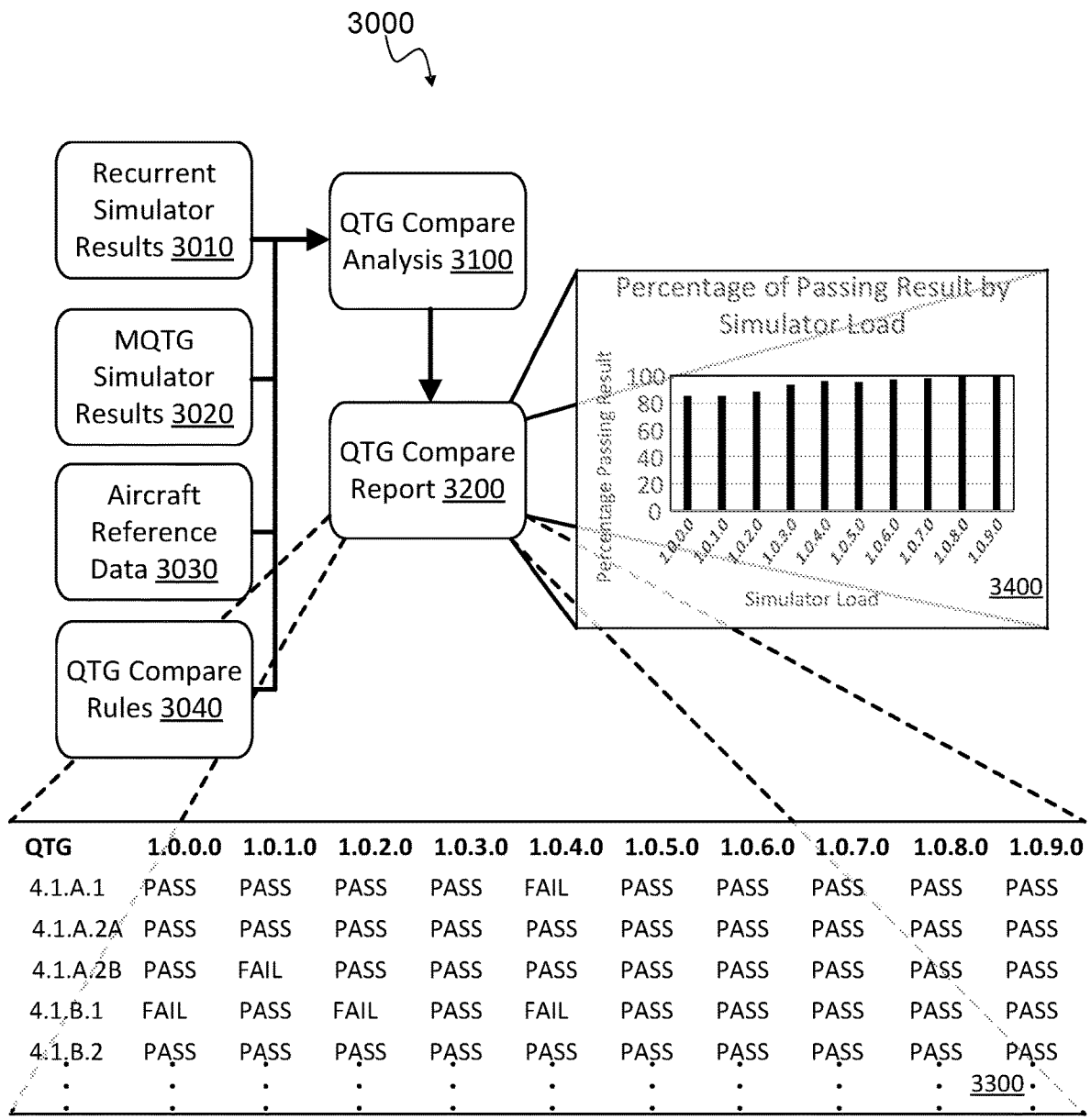
FIG. 3 is a flow chart of a first exemplary method in accordance with the teachings of the present invention.

FIG. 3 provides an exemplary flow chart and result chart for generated during recertification 3000 of a flight simulator. In the example of FIG. 3, different "simulator loads" correspond to different software and/or hardware revisions being loaded into the flight simulator. The QTGs (e.g., 4.1.A.1, 4.1.A.2.A, etc.) are examples of specific tests that the flight simulator has to pass (e.g., reaction of the simulated plane to a given command (e.g., on the throttle) under specified initial parameters (e.g., of speed and altitude)). The Recurrent Simulator Results 3010 represent the latest set of QTG results obtained from the flight simulator (e.g., by stimulating the instruments of the flight simulator). The MQTG Simulator Results 3020 represent the QTG results that have been approved by the relevant authority for the flight simulator. The Aircraft Reference Data 3030 represents data collected from flight test aircraft or computer simulation against which the flight simulator's results are evaluated (e.g., provided by authorities and/or OEM of the actual aircraft being simulate by the simulated aircraft). The QTG Compare Rules 3040 represent defined rules to be used when applying automated objective evaluation of the recurring results (3010) against the MQTG 3020. The QTG Compare Analysis 3100 represent execution of the analysis during which multiple three-way comparisons are made. The QTG Compare Report 3200 corresponds to presentation of the results from the QTG Compare Analysis 3100, e.g., presented using a tabular structure (e.g., 3300) and/or graphs (e.g., 3400) that may be printed or presented on screen to decision makers).

A method is generally conceived to be a self-consistent sequence of steps leading to a desired result. These steps require physical manipulations of physical quantities. Usually, though not necessarily, these quantities take the form of electrical or magnetic/electromagnetic signals capable of being stored, transferred, combined, compared, and otherwise manipulated. It is convenient at times, principally for reasons of common usage, to refer to these signals as bits, values, parameters, items, elements, objects, symbols, characters, terms, numbers, or the like. It should be noted, however, that all of these terms and similar terms are to be associated with the appropriate physical quantities and are merely convenient labels applied to these quantities.

The description of the present invention has been presented for purposes of illustration but is not intended to be exhaustive or limited to the disclosed embodiments. Many modifications and variations will be apparent to those of ordinary skill in the art. The embodiments were chosen to explain the principles of the invention and its practical applications and to enable others of ordinary skill in the art to understand the invention in order to implement various embodiments with various modifications as might be suited to other contemplated uses.

What is claimed is:

1. A method for recertifying an interactive computer simulation station from certification rules provided by an authoritative source, the interactive computer simulation station executing an interactive computer simulation comprising a plurality of interrelated parameters defining a dynamic behavior of a simulated interactive object, in an interactive computer simulation environment, when inputs are provided on one or more tangible instruments of the interactive computer simulation station, the method comprising:
   obtaining baseline results of the interactive computer simulation station, generated upon certification thereof by the authoritative source, for each of the interrelated parameters;
   while executing the interactive computer simulation in the interactive computer simulation station, stimulating one or more tangible instruments in real-time for generating subsequent test results for each of the interrelated parameters;
   identifying one or more deviated parameters for which a test result value is incompliant with a target value provided in the certification rules and, for each one of the deviated parameters:
   receiving a previously certified deviated value corresponding to a baseline value from the baseline results for the one deviated parameter;
   computing a previously accepted deviation value between the previously certified deviated value and the target value from the certification rules;

computing a challenged deviation value between the test result value and the target value from the certification rules the baseline value;

computing a delta deviation value between the previously accepted deviation value and the challenged deviation value;

when the delta deviation value is outside of an acceptable deviation range, identifying the one deviated parameter as a challenged parameter;

when the delta deviation value is within the acceptable deviation range:

identifying the one deviated parameter as an equivalent parameter; and associating an original justification for the previously certified deviated value from the baseline results with the one deviated parameter.

2. The method of claim 1, further comprising submitting the subsequent test results with any original justifications for recertifying the interactive computer simulation station when no challenged parameter is identified.

3. The method of claim 1, wherein, when the one deviated parameter is identified as a challenged parameter, one or more of the tangible instruments is identified as possibly defective.

4. The method of claim 3, further comprising, following revision of the one or more of the tangible instruments identified as possibly defective, restimulating the one or more tangible instruments in real-time for generating additional test results for each of the interrelated parameters.

5. The method of claim 4, further comprising submitting the additional test results with any original justifications for recertifying the interactive computer simulation station when no challenged parameter is identified following from the generated additional test results.

6. The method of claim 1, wherein the authoritative source comprises at least one of the Federal Aviation Administration (FAA) in the USA, the National Civil Aviation Agency (ANAC) in Brazil, the European Aviation Safety Agency (EASA) in the European Union or Transport Canada.

7. The method of claim 6, wherein Qualification Test Guide (QTG) methodology is used for generating the baseline results and the subsequent test results.

8. The method of claim 7, wherein the simulated interactive object is a simulated aircraft and the plurality of interrelated parameters comprises a drag value, a side-force value, a lift value, a pitch value, a roll value, a yaw value and a power profile and a plurality of simulated constraints associated to the computer generated environment comprises gravitational force and atmospheric pressure.

9. The method of claim 1, further comprising identifying one or more of the plurality of interrelated parameters as a challenged parameter when corresponding testing methodology is incompatible with the baseline results.

10. The method of claim 1, further comprising identifying one or more of the plurality of interrelated parameters as a challenged parameter when a corresponding target value is incompatible with the baseline results.

11. A computer system for recertifying an interactive computer simulation station from certification rules provided by an authoritative source, the interactive computer simulation station executing an interactive computer simulation comprising a plurality of interrelated parameters defining a dynamic behavior of a simulated interactive object, in an interactive computer simulation environment, when inputs are provided on one or more tangible instruments, the computer system comprising:

one or more storage systems for:

storing the certifications rules provided by the authoritative source; and storing baseline results of the interactive computer simulation station, generated upon certification thereof by the authoritative source, for each of the interrelated parameters;

the tangible instruments being stimulated, while executing the interactive computer simulation, in real-time for generating subsequent test results for each of the interrelated parameters, the subsequent test results being stored in the one or more storage systems; and a processor module that:

identifies one or more deviated parameters for which a test result value is incompliant with a target value provided in the certification rules and, for each one of the deviated parameters:

receives a previously certified deviated value corresponding to a baseline value from the baseline results for the one deviated parameter;

computes a previously accepted deviation value between the previously certified deviated value and the target value from the certification rules;

computes a challenged deviation value between the test result value and the target value from the certification rules the baseline value;

computes a delta deviation value between the previously accepted deviation value and the challenged deviation value;

when the delta deviation value is outside of an acceptable deviation range, identifies the one deviated parameter as a challenged parameter;

when the delta deviation value is within the acceptable deviation range:

identifies the one deviated parameter as an equivalent parameter; and associates an original justification for the previously certified deviated value from the baseline results with the one deviated parameter.

12. The computer system of claim 11, wherein the processor module further submits the subsequent test results with any original justifications for recertifying the interactive computer simulation station when no challenged parameter is identified.

13. The computer system of claim 11, wherein, when the one deviated parameter is identified as a challenged parameter, one or more of the tangible instruments is identified as possibly defective.

14. The computer system of claim 13, wherein the one or more tangible instruments identified as possibly defective, following revision thereof, are restimulated in real-time for generating additional test results for each of the interrelated parameters.

15. The computer system of claim 14, wherein the processor module further submits the additional test results with any original justifications for recertifying the interactive computer simulation station when no challenged parameter is identified following from the generated additional test results.

16. The computer system of claim 11, wherein the authoritative source comprises at least one of the Federal Aviation Administration (FAA) in the USA, the National Civil Aviation Agency (ANAC) in Brazil, the European Aviation Safety Agency (EASA) in the European Union or Transport Canada.

17. The computer system of claim 16, wherein Qualification Test Guide (QTG) methodology is used for generating the baseline results and the subsequent test results.

18. The computer system of claim 17, wherein the simulated interactive object is a simulated aircraft and the plurality of interrelated parameters comprises a drag value, a side-force value, a lift value, a pitch value, a roll value, a yaw value and a power profile and a plurality of simulated constraints associated to the computer generated environment comprises gravitational force and atmospheric pressure.

19. The computer system of claim 11, wherein the processor module further identifies one or more of the plurality of interrelated parameters as a challenged parameter when corresponding testing methodology is incompatible with the baseline results.

20. The computer system of claim 11, wherein the processor module further identifies one or more of the plurality of interrelated parameters as a challenged parameter when a corresponding target value is incompatible with the baseline results.

* * * * *